US012805403B2

(12) United States Patent
Pamidighantam et al.

(10) Patent No.: US 12,805,403 B2
(45) Date of Patent: Nov. 17, 2026

(54) THREE LAYER SYSTEM IN PACKAGE AND A METHOD OF ENABLING THEREOF

(71) Applicant: LightSpeed Photonics Pte Ltd, Singapore (SG)

(72) Inventors: Venkata Ramana Pamidighantam, Hyderabad (IN); Shushil Kumar Penumaka, Hyderabad (IN); Rohin Kumar Yeluripati, Secunderabad (IN)

(73) Assignee: LightSpeed Photonics Pte Ltd, Singapore (SG)

(*) Notice: Subject to any disclaimer, the term of this patent is extended or adjusted under 35 U.S.C. 154(b) by 355 days.

(21) Appl. No.: 18/525,356

(22) Filed: Nov. 30, 2023

(65) Prior Publication Data

US 2024/0178210 A1 May 30, 2024

(30) Foreign Application Priority Data

Nov. 30, 2022 (SG) ........................... 10202260266X

(51) Int. Cl.
*H10W 90/00* (2026.01)
*H10B 80/00* (2026.01)

(52) U.S. Cl.
CPC ............ *H10W 90/00* (2026.01); *H10B 80/00* (2023.02)

(58) Field of Classification Search
CPC ....... H10W 90/00; H10B 80/00; H10K 39/10; H10K 39/12; H10K 39/15; H10K 39/18; H10K 39/601; H10K 39/621; H10K 59/90; H10K 59/95
See application file for complete search history.

(56) References Cited

U.S. PATENT DOCUMENTS

| | | | | |
|---|---|---|---|---|
| 12,164,161 | B1 * | 12/2024 | Winterbottom | G01K 7/028 |
| 12,368,081 | B2 * | 7/2025 | Lin | H01L 23/5286 |
| 12,442,998 | B2 * | 10/2025 | Winterbottom | G02B 6/4295 |
| 2015/0003792 | A1 * | 1/2015 | Mathai | G02B 6/4285 385/88 |
| 2015/0003841 | A1 * | 1/2015 | McLaren | G02B 6/43 398/141 |
| 2018/0190593 | A1 * | 7/2018 | Gaines | H01L 25/167 |
| 2020/0312755 | A1 * | 10/2020 | Choi | H01L 23/5384 |
| 2021/0183777 | A1 * | 6/2021 | Yim | H01L 23/3128 |
| 2022/0189835 | A1 * | 6/2022 | Yim | H01L 23/5389 |
| 2024/0178210 | A1 * | 5/2024 | Pamidighantam | H10B 80/00 |
| 2025/0231432 | A1 * | 7/2025 | Winterbottom | G01K 7/028 |

* cited by examiner

*Primary Examiner* — Jacob Y Cho
(74) *Attorney, Agent, or Firm* — Barta Jones, PLLC

(57) ABSTRACT

The opto-electronic engine (100) includes three layers: a first layer (101) housing processors (104) and optoelectronic connectors (717) surrounding the processors; a second layer (103) connected to the first layer, featuring first memories (709A) and electronic components on its first surface (123) and second memories (709B) and components on its second surface (125); and a third layer (105) connected to the first or second layer, possessing different electronic components on its first surface (127) and distinct components (130) on its second surface (129).

10 Claims, 14 Drawing Sheets

THREE LAYER SYSTEM IN PACKAGE AND A METHOD OF ENABLING THEREOF

CROSS-REFERENCE TO RELATED APPLICATIONS

This application claims priority from Singapore Provisional Patent Application No. SG10202260266X, titled "ASSEMBLY OF AN OPTO-ELECTRONIC ENGINE" and filed on Nov. 30, 2022, which is incorporated herein by reference.

DESCRIPTION OF THE INVENTION

Technical Field of the Invention

The present invention relates to hardware design in communication and computing hardware technology domain. More specifically, the invention relates to assembly of a 3-layer opto-electronic engine.

BACKGROUND OF THE INVENTION

With the Processor performance becoming extremely power hungry, designers are looking at integrating multiple chiplets in a package to manage the heat dissipation. Vertical interconnects provide the shortest link between chips in a package. Heterogeneous integration uses packaging technology to integrate different chips or components from different foundries with different wafer sizes and feature sizes on different substrates. Modern data centers are having pluggable optical transceivers at card edge for external I/O. As next generation computation and storage requires infrastructures which are closer to the processor to increase data bandwidth and reduce power consumption. However, there is a need for a heterogeneous integration with a co-package of optics with processor and memory. This set of components reduce assembly and cost required for construction with increase in throughput.

OBJECT OF THE INVENTION

The principal object of the invention is to enable a cost-effective processing system for communication systems, computation and storage centers.

Another object of the invention relates to methods and system for enabling integration of optical transceivers and programmable logic devices within a single package to overcome limitations of copper based and conventional optical systems in processors.

To scale up total optical I/O of processors from Gbps to Terabits a three-layered structure consisting of two FPGA integrated with 12 high speed transceiver interconnects.

To get flexible transfer of data at desired rates in run-time Clock-ICs will operate alongside FPGA with different speeds, several clock signals are connected. To control and monitor high speed transceivers and PLL ICs an I2C is connected. Power ICs and FPGAs temperature and voltage is monitored by MAX 10.

To give effective power supply to input and output due to detailed overview of FPGAs, powering them and also to effectively manage power supply they have power ICs.

These and other objects and characteristics of the present invention will become apparent from the further disclosure to be made in the detailed description given below.

SUMMARY OF THE INVENTION

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The problem of low-speed interconnections and limited processing capacity is solved by using a heterogeneous integration of various components along with high-speed transceivers and processors that are coupled with memory. The opto-electronic engine comprises three layers: a first layer housing processors and optoelectronic connectors surrounding the processors; a second layer connected to the first layer, featuring first memories and electronic components on its first surface and different memories and components on its second surface; and a third layer connected to the first or second layer, possessing different electronic components on its first surface and distinct components on its second surface.

To the accomplishment of the foregoing and related ends, the one or more aspects comprise the features hereinafter fully described and particularly pointed out in the claims. The following description and the drawings set forth in detail certain illustrative features of one or more aspects. These features are indicative, however, of but a few of the various ways in which the principles of various aspects may be employed, and this description is intended to include all such aspects and their equivalents.

BRIEF DESCRIPTION OF DRAWINGS

The foregoing and other features of embodiments will become more apparent from the following detailed description of embodiments when read in conjunction with the accompanying drawings. In the drawings, like reference numerals refer to like elements.

In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention. Throughout the disclosure the system and the foot tracing system may interchangeably be used.

The system architecture provides modularity with processor and high data I/O as the first layer, peripherals, clock and system controller as the second layer and power supply and external I/O as the third layer. Each layer can be tested independently and replaced easily due to the edge connector providing flexibility to the application designers.

Figure 1A:
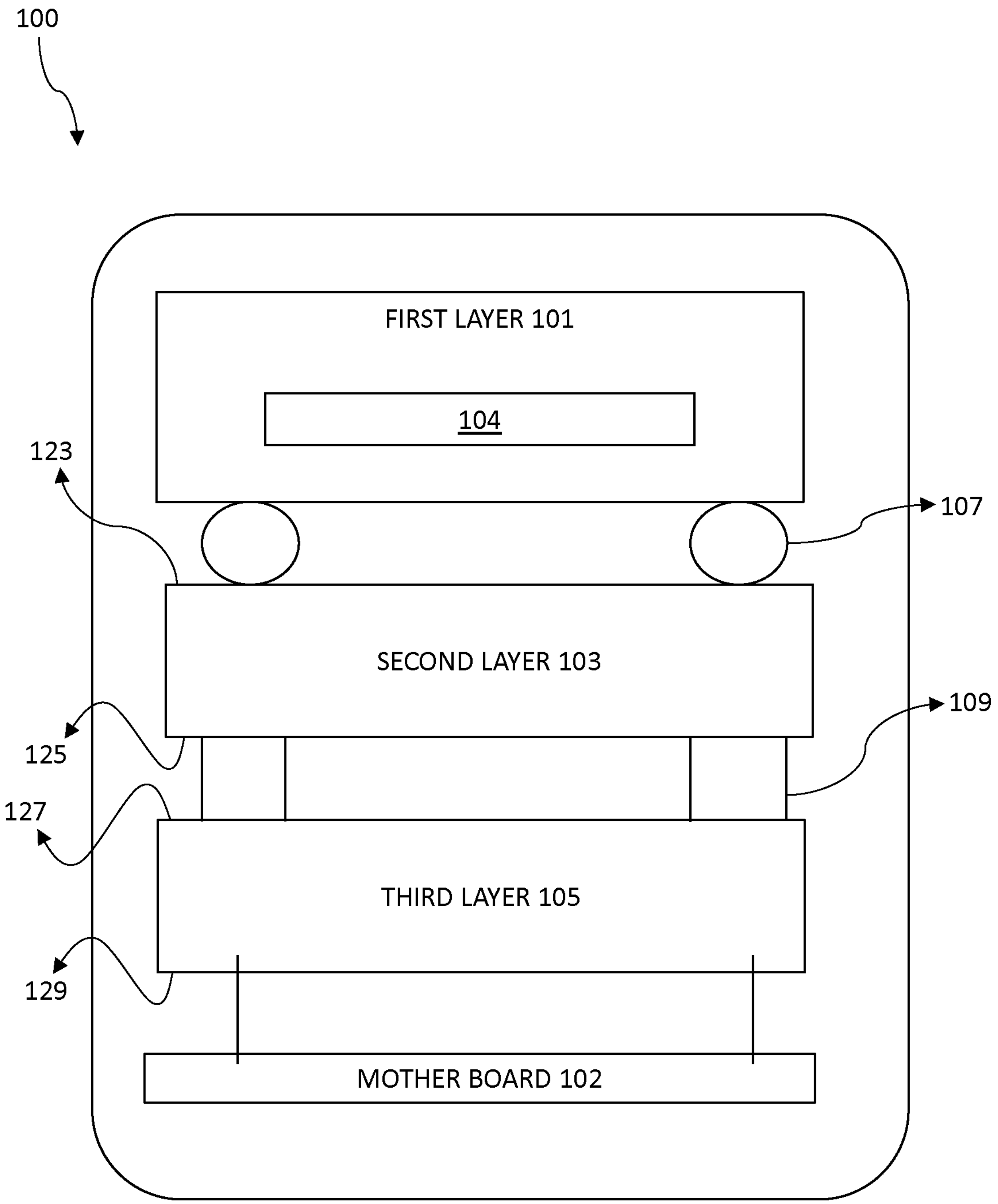

FIG. 1A illustrates system architecture in case of assembly of a 3-layer opto-electronic engine, according to one example embodiments of the invention.

Figure 1B:
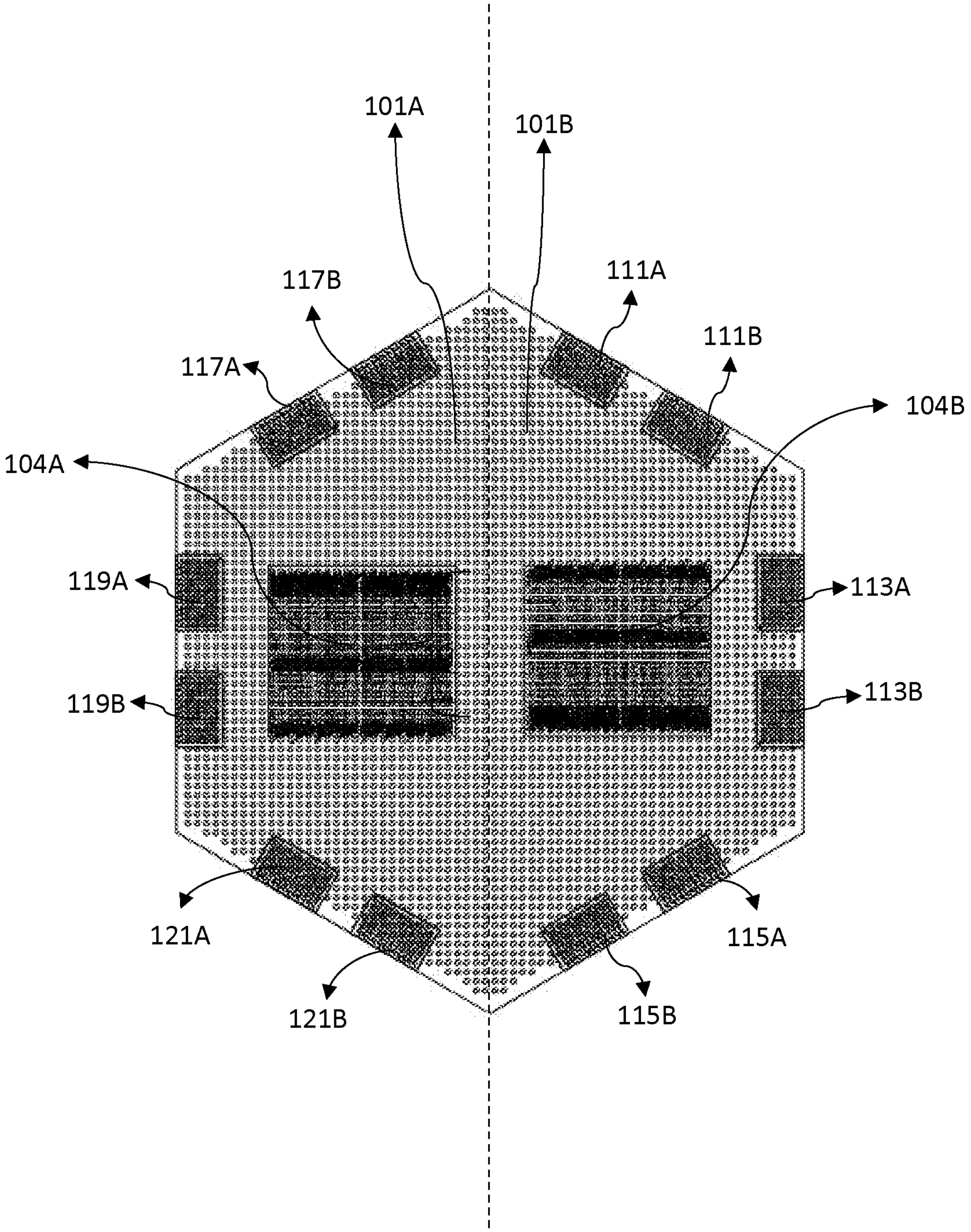

FIG. 1B illustrates topside view of first layer of assembly of a 3-layer opto-electronic engine-combination of two identical interposer layers, according to one example embodiments of the invention.

Figure 1C:
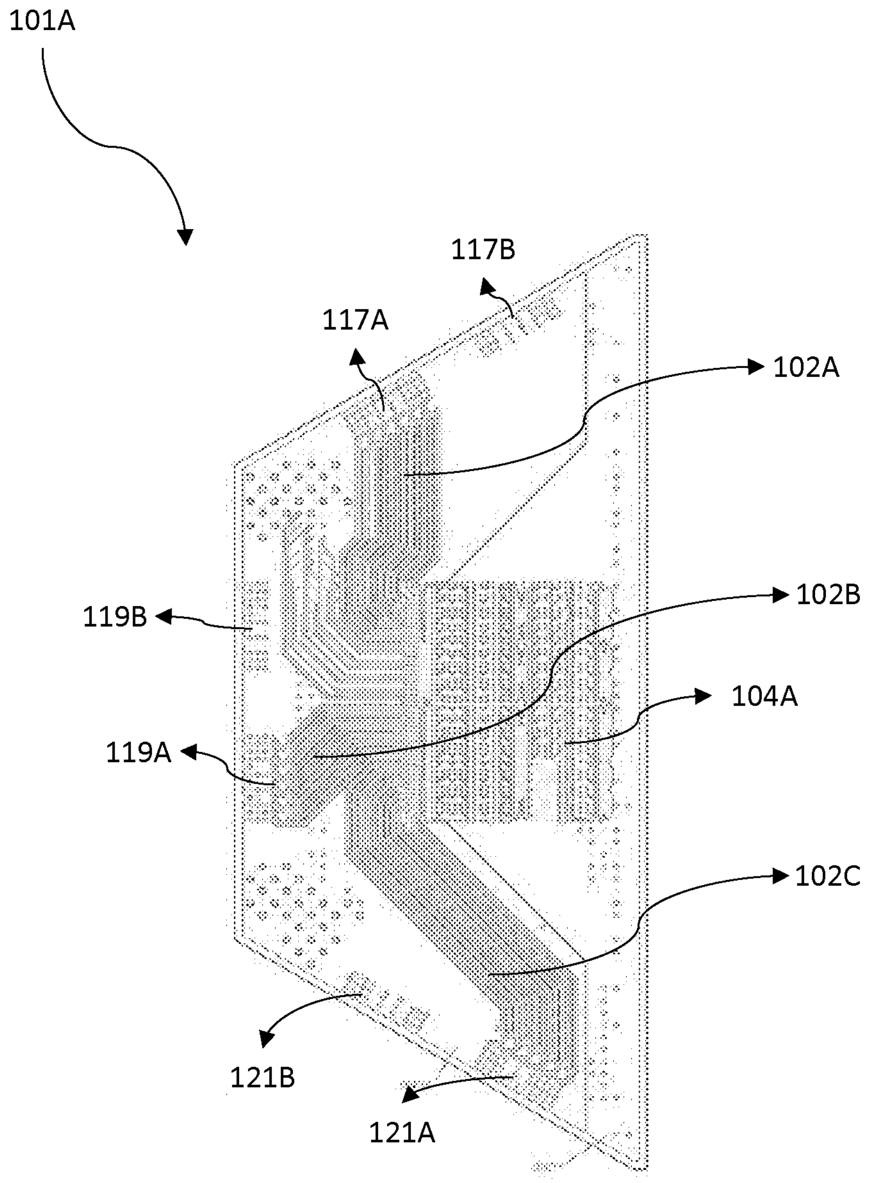

FIG. 1C illustrates schematic view of left interposer associated with first layer of assembly of a 3-layer opto-electronic engine, according to one example embodiments of the invention.

Figure 1D:
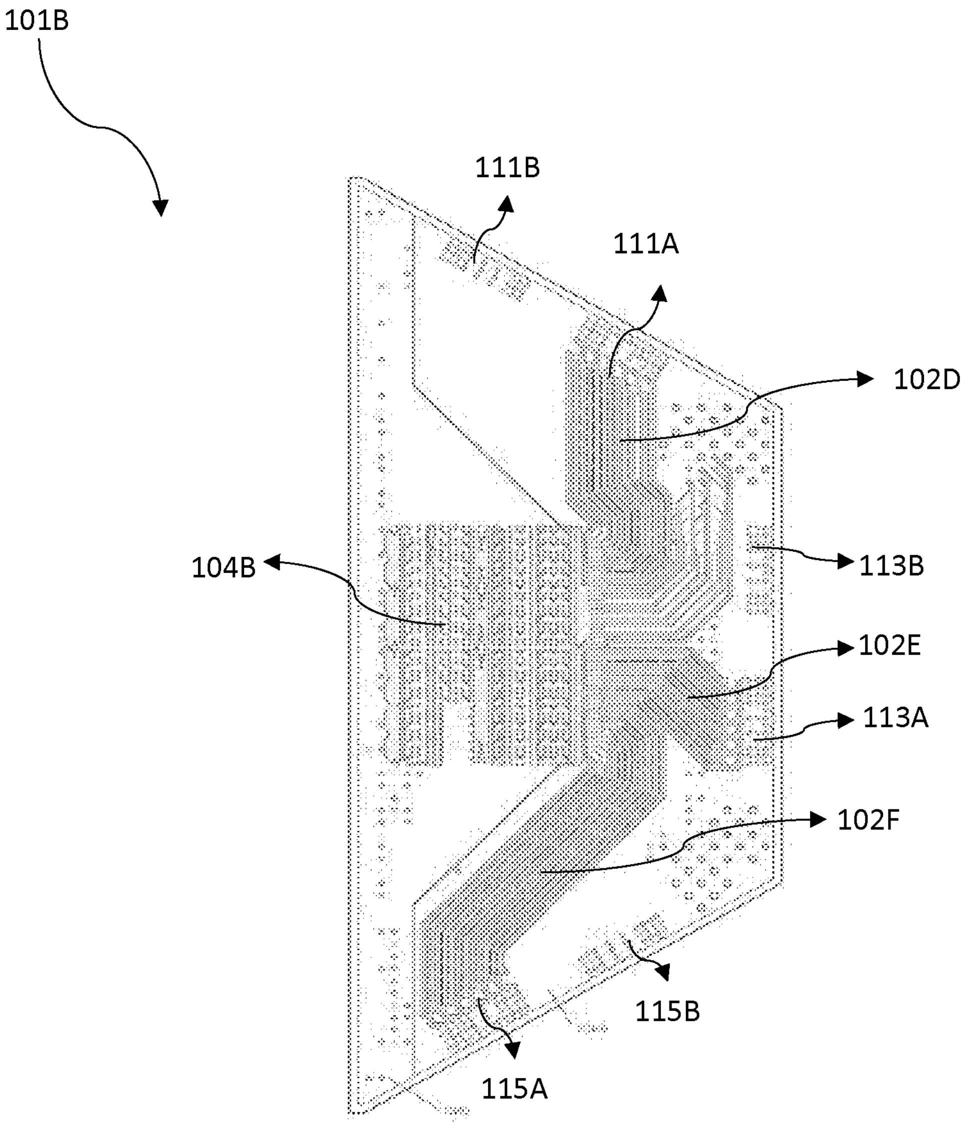

FIG. 1D illustrates schematic view of right interposer associated with first layer of assembly of a 3-layer opto-electronic engine, according to one example embodiments of the invention. Both the left and right interposers could be the same design as a common module.

Figure 2A:
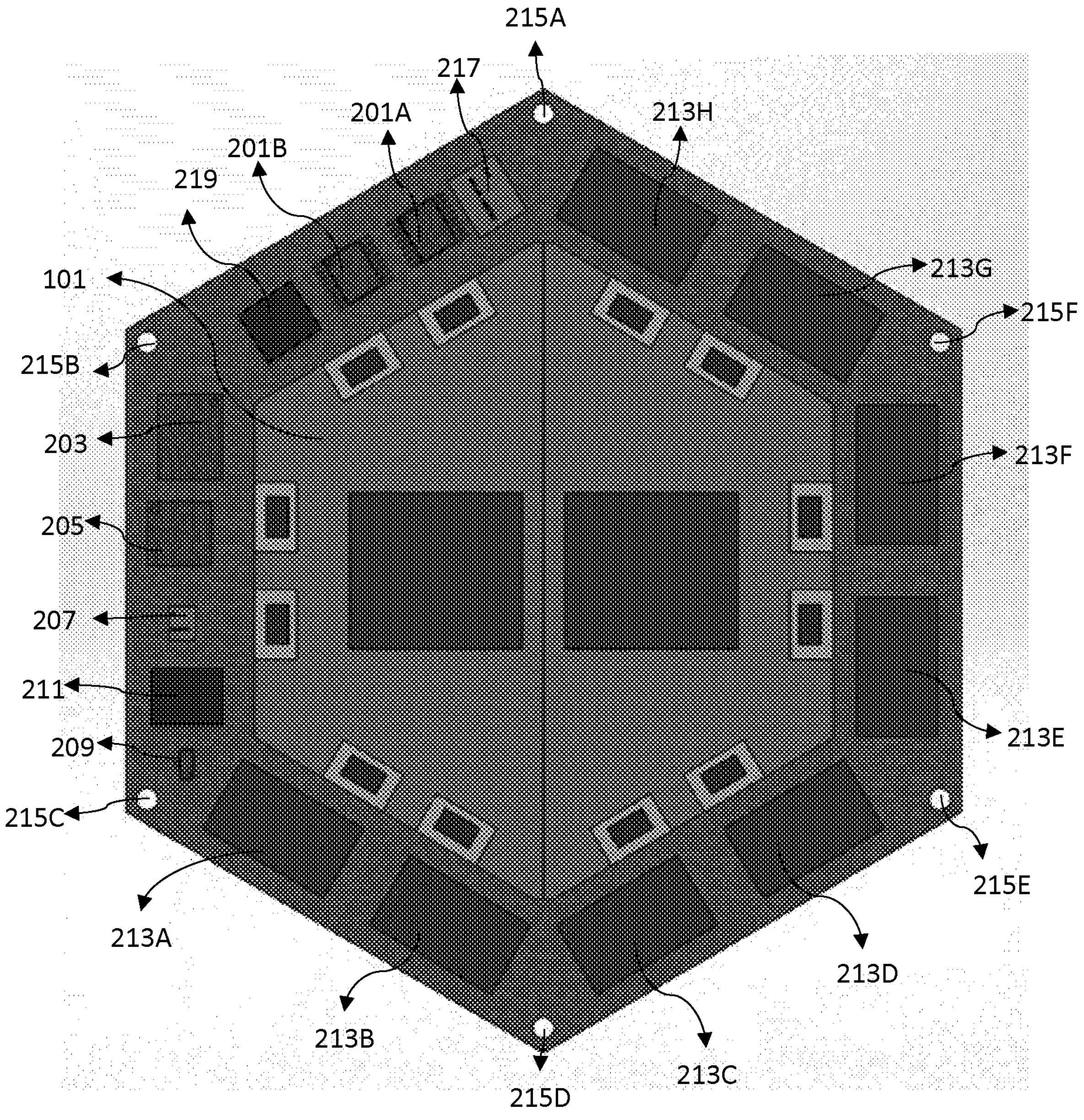

FIG. 2A illustrates schematic view of a system architecture of top side associated with second layer of assembly of a 3-layer opto-electronic engine, according to one example embodiments of the invention.

Figure 2B:
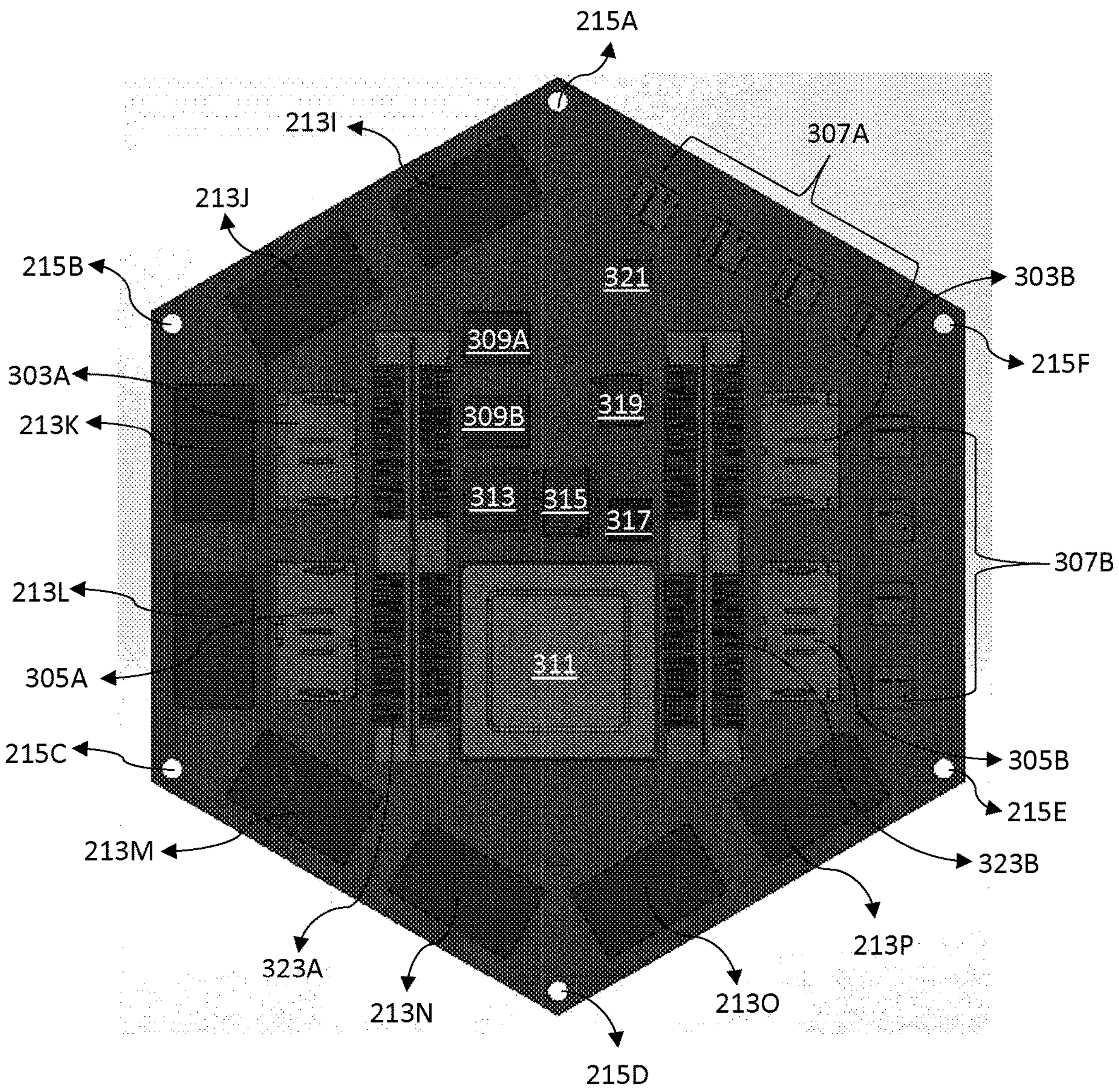

FIG. 2B illustrates schematic view of a system architecture of bottom side associated with second layer of assembly of a 3-layer opto-electronic engine, according to one example embodiments of the invention.

Figure 3A:
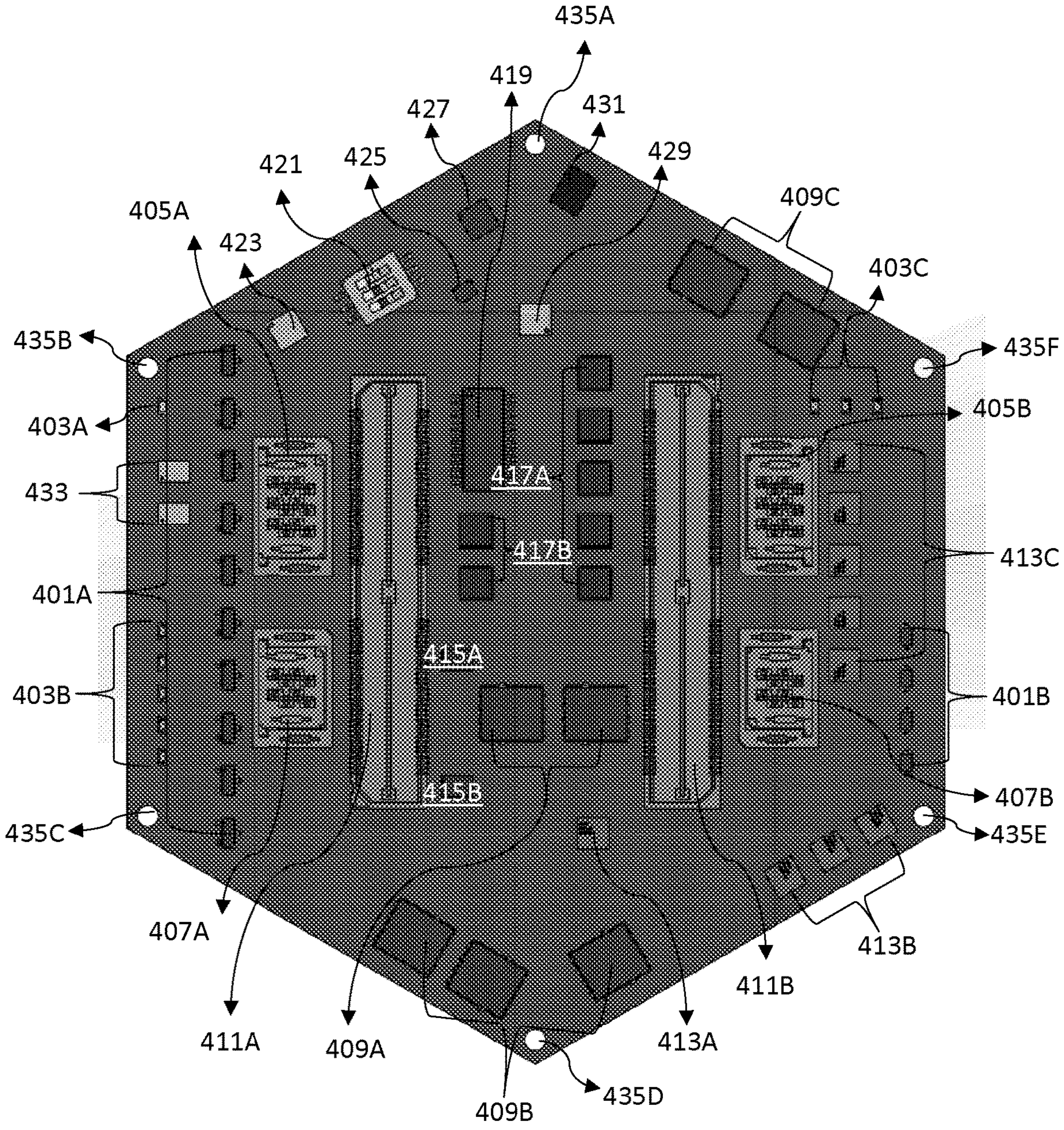

FIG. 3A illustrates schematic view of a system architecture of top side associated with third layer of assembly of a 3-layer opto-electronic engine, according to one example embodiments of the invention.

Figure 3B:
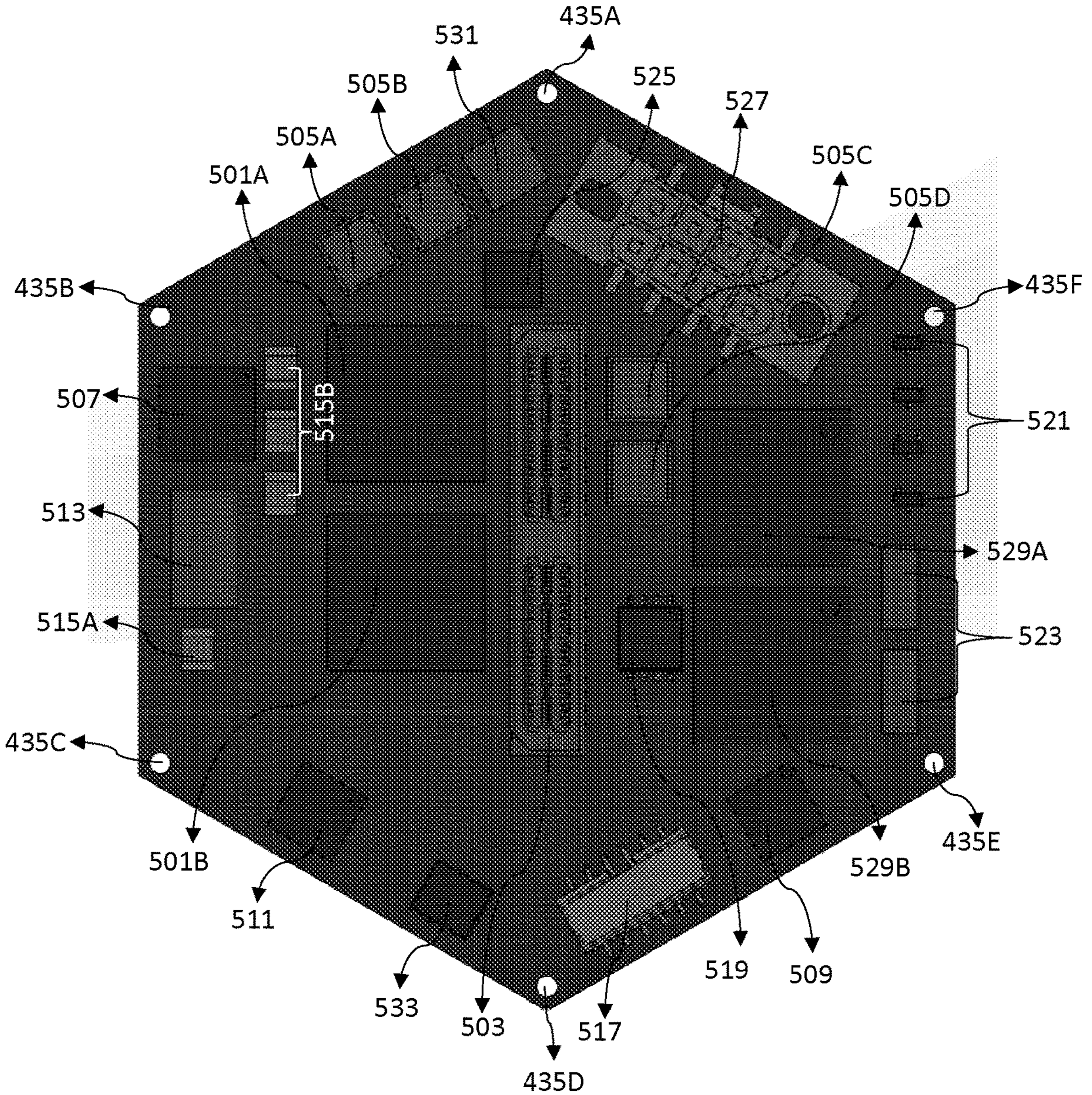

FIG. 3B illustrates schematic view of a system architecture of bottom side associated with third layer of assembly of a 3-layer opto-electronic engine, according to one example embodiments of the invention.

Figure 4:
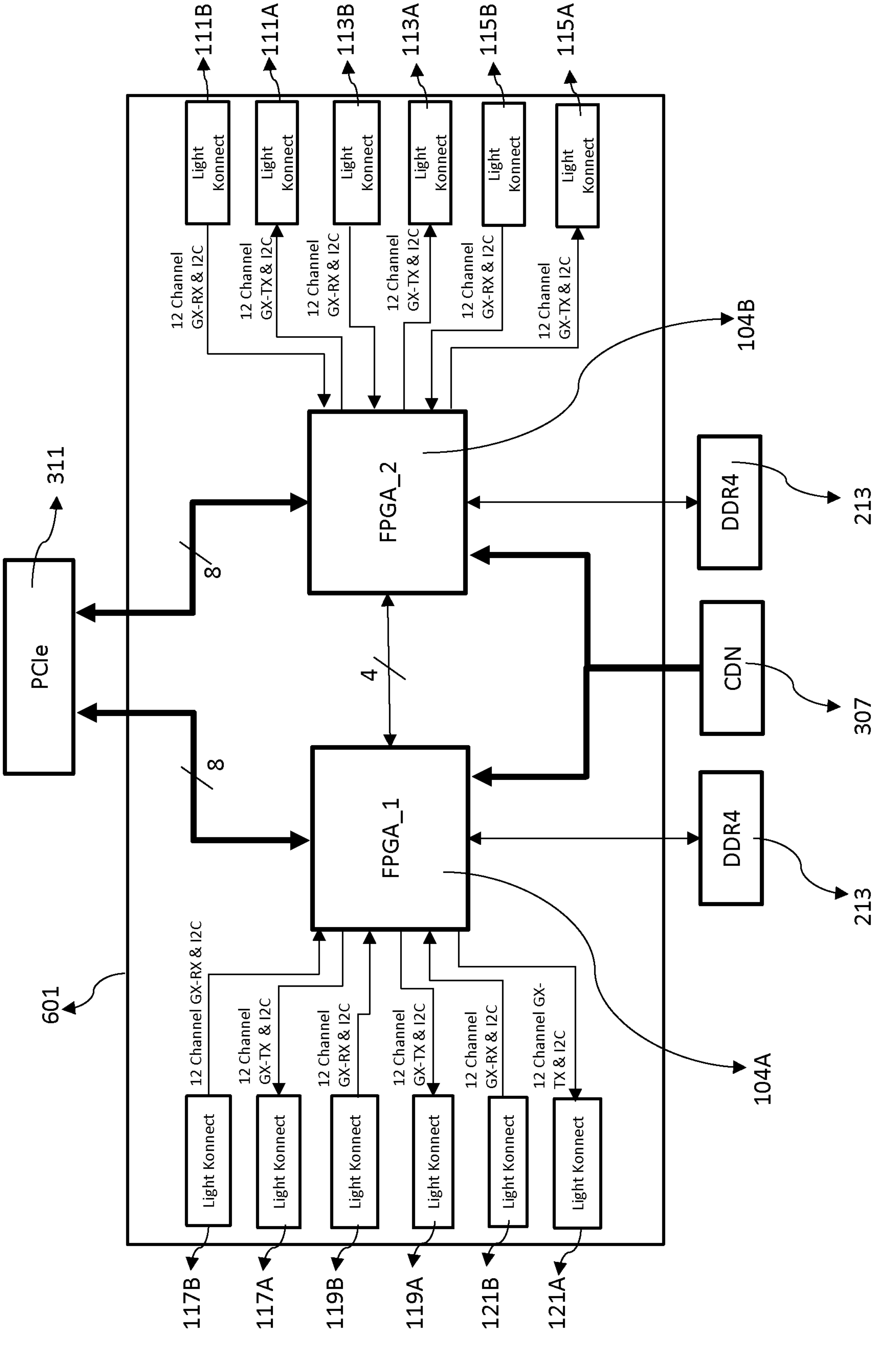

FIG. 4 illustrates a block diagram of first layer associated with assembly of a 3-layer opto-electronic engine, according to one example embodiments of the invention.

Figure 5:
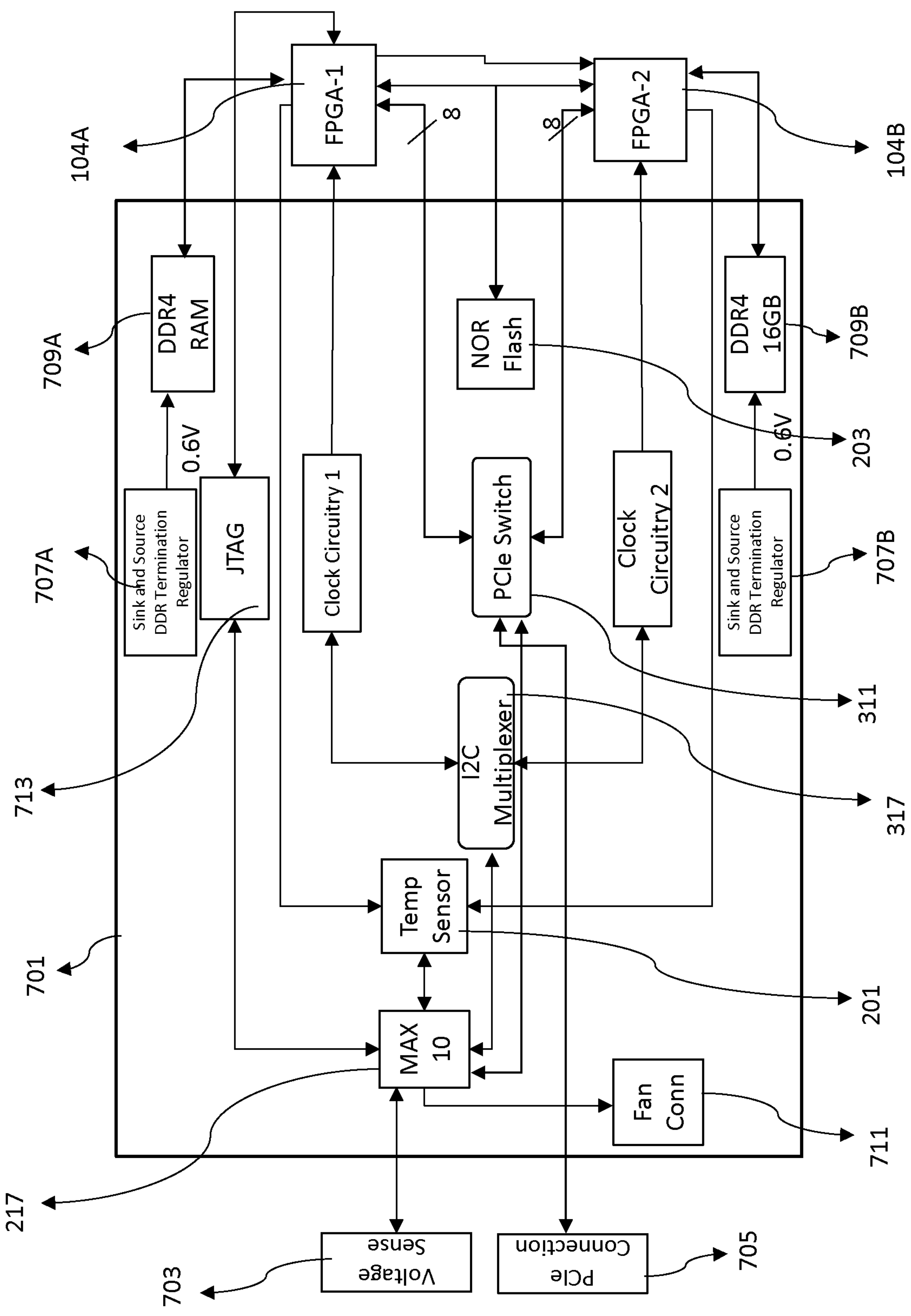

FIG. 5 illustrates a block diagram of a system architecture of second layer associated with assembly of a 3-layer opto-electronic engine, according to one example embodiments of the invention.

Figure 6:
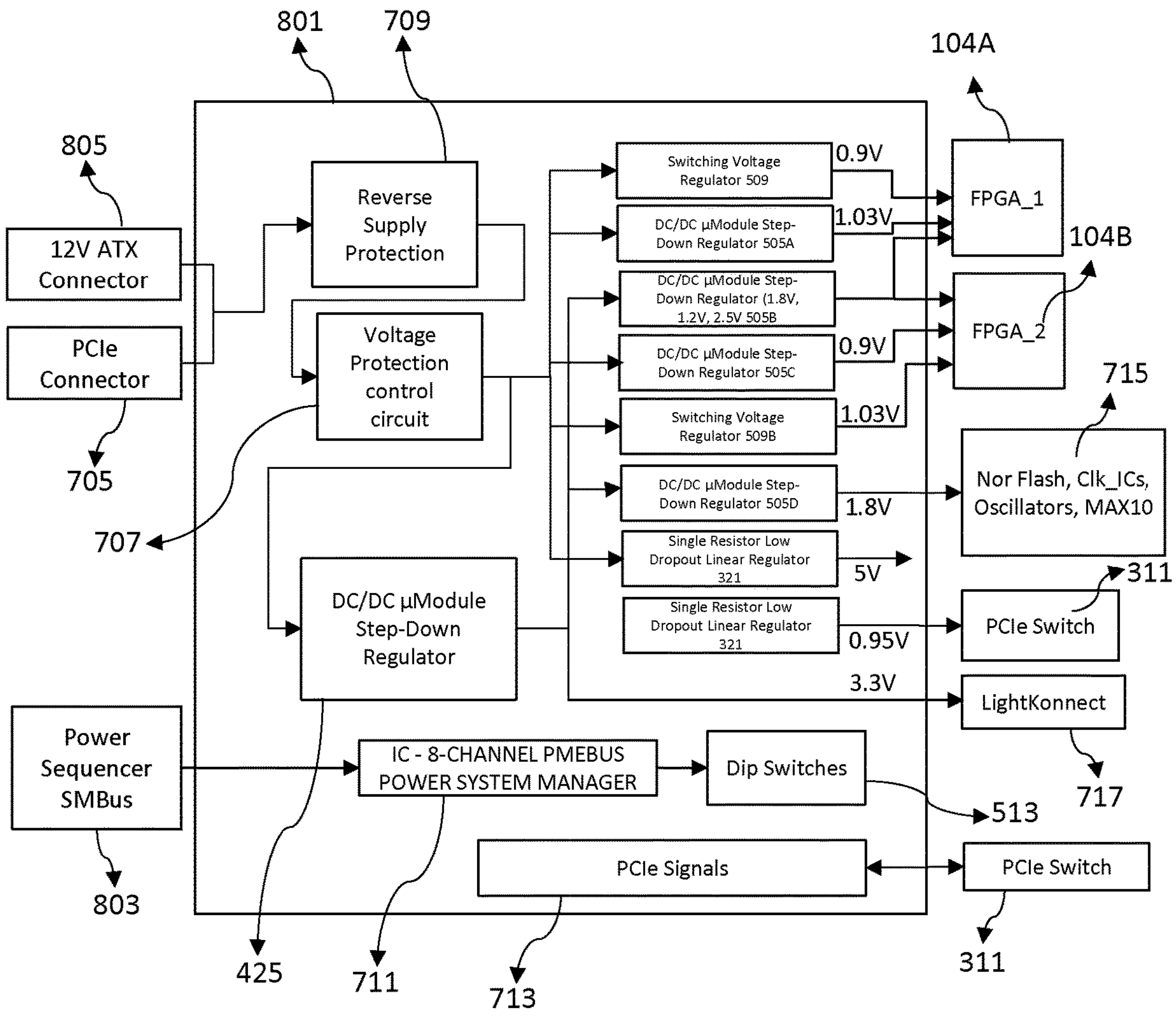

FIG. 6 illustrates a block diagram of a system architecture of third layer associated with assembly of a 3-layer opto-electronic engine, according to one example embodiments of the invention.

Figure 7A:
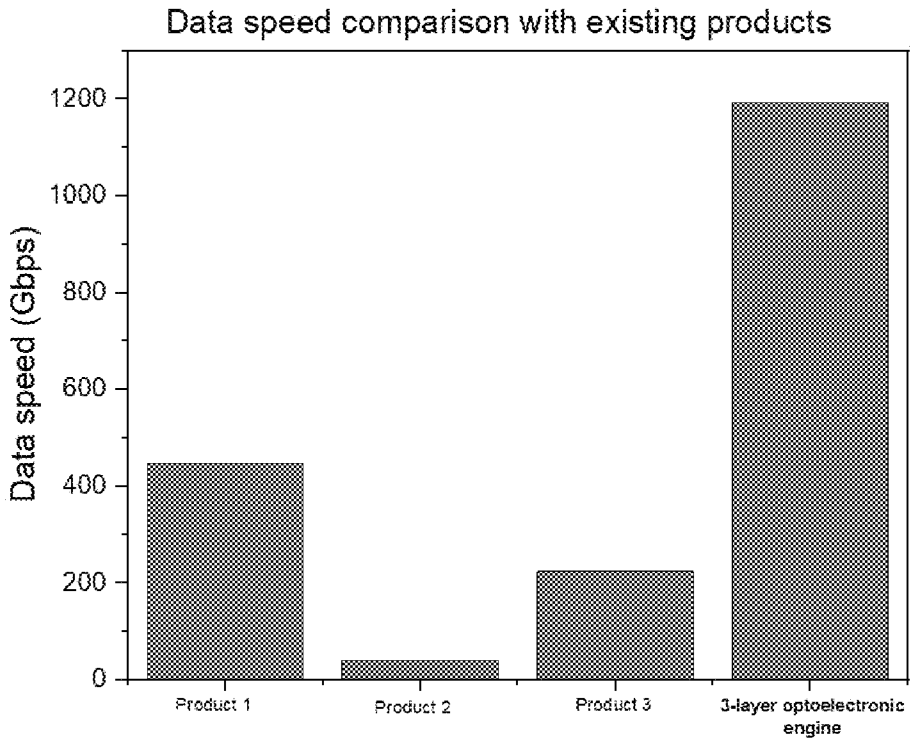

FIG. 7A illustrates a graph of data speed comparison in a 3-layer opto-electronic engine with similar existing products, according to one example embodiments of the invention.

Figure 7B:
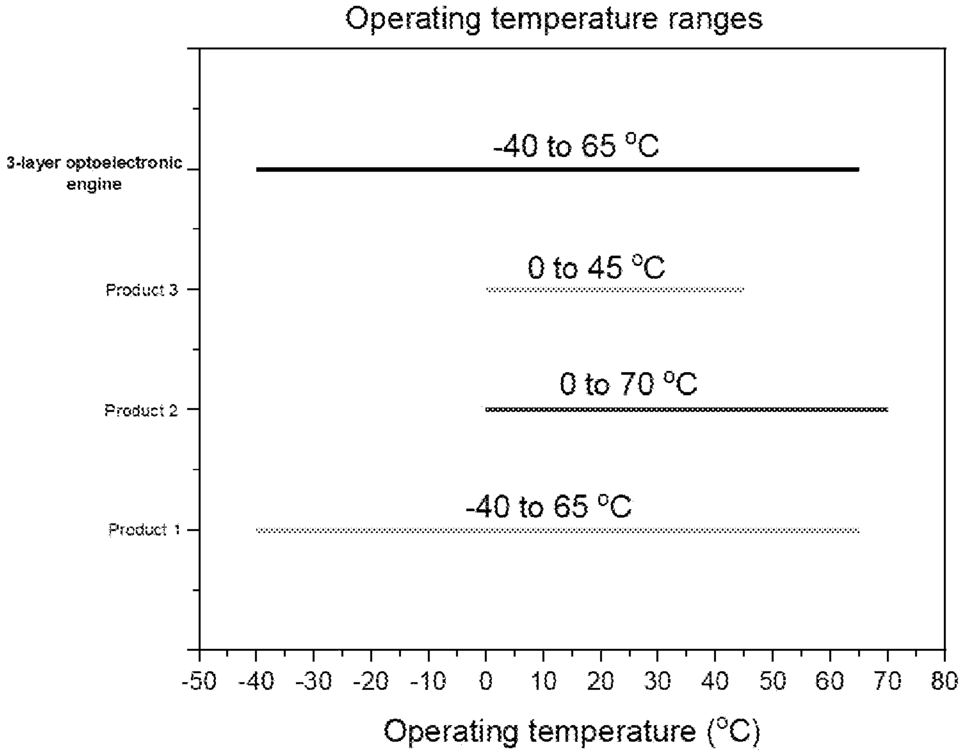

FIG. 7B illustrates a graph of operating temperature comparison in a 3-layer opto-electronic engine with similar existing products, according to one example embodiments of the invention.

Figure 7C:
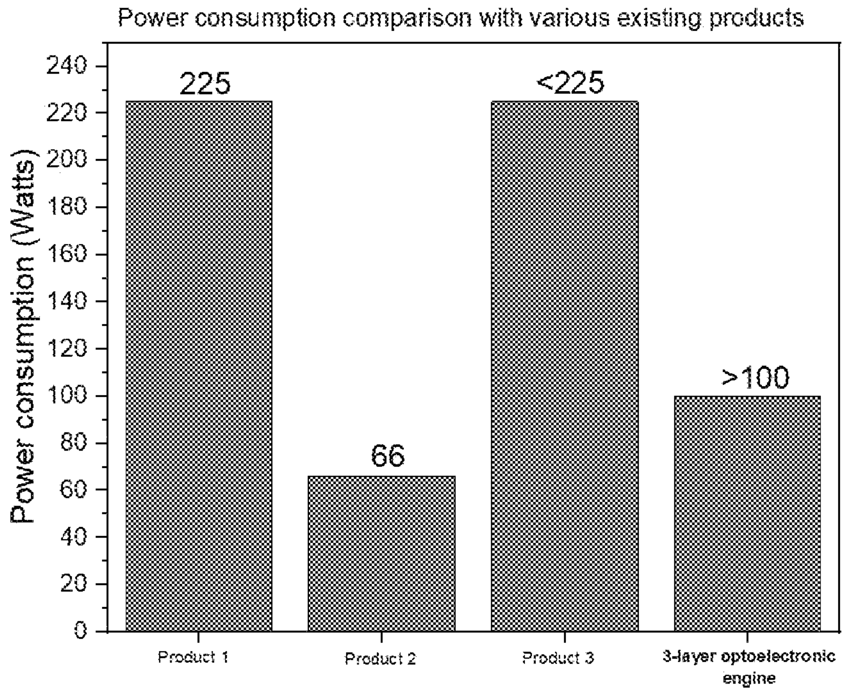

FIG. 7C illustrates a graph of power consumption comparison in a 3-layer opto-electronic engine with similar existing products, according to one example embodiments of the invention.

Figure 7D:
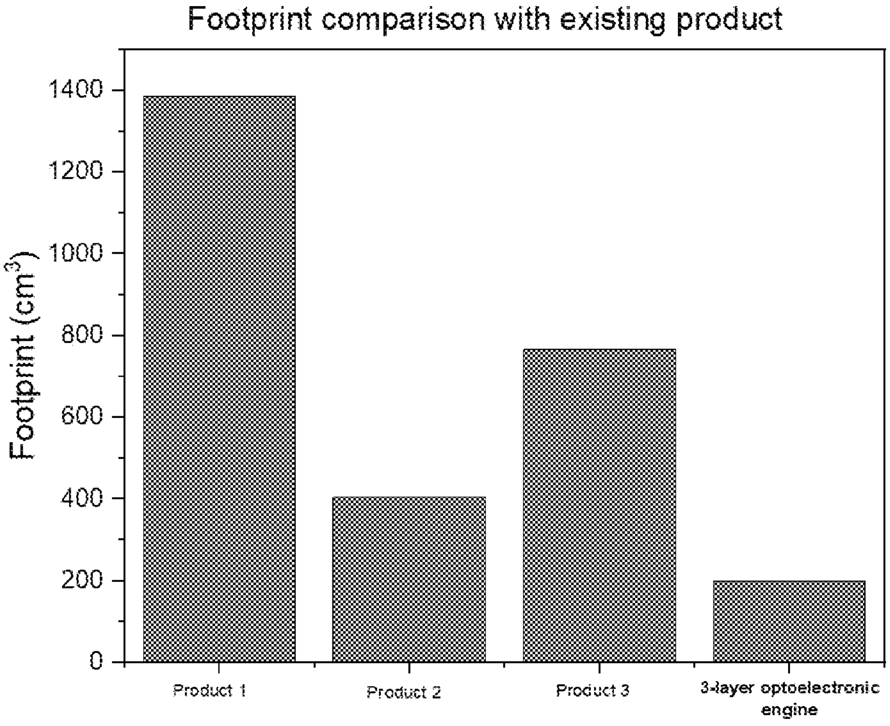

FIG. 7D illustrates a graph of footprint comparison in a 3-layer opto-electronic engine with similar existing products, according to one example embodiments of the invention.

Figure 7E:
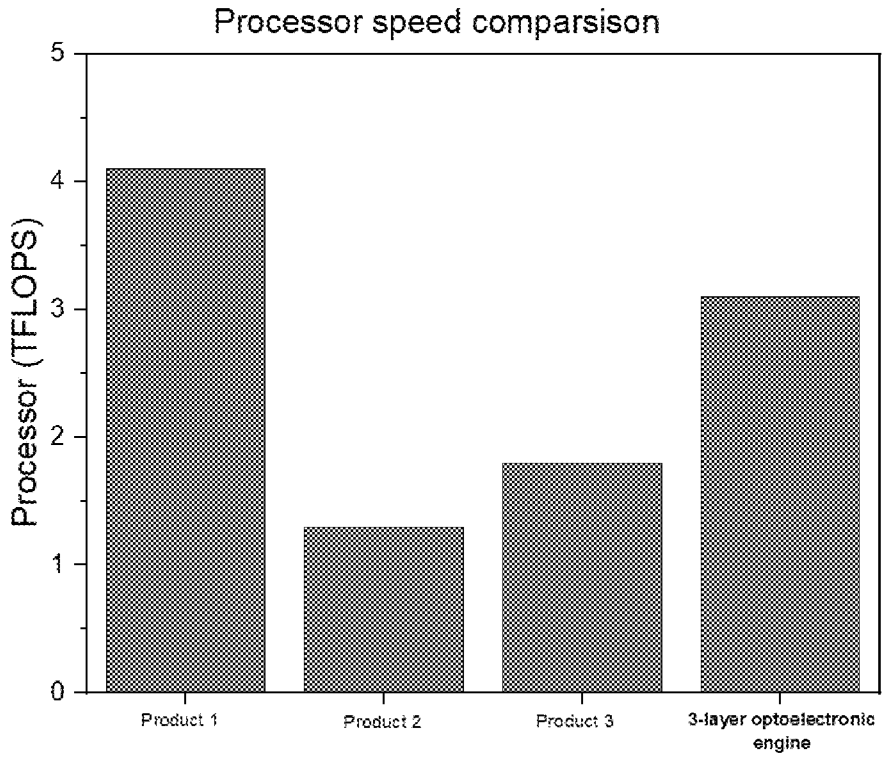

FIG. 7E illustrates a graph of processor speed comparison in a 3-layer opto-electronic engine with similar existing products, according to one example embodiments of the invention.

Figure 7F:
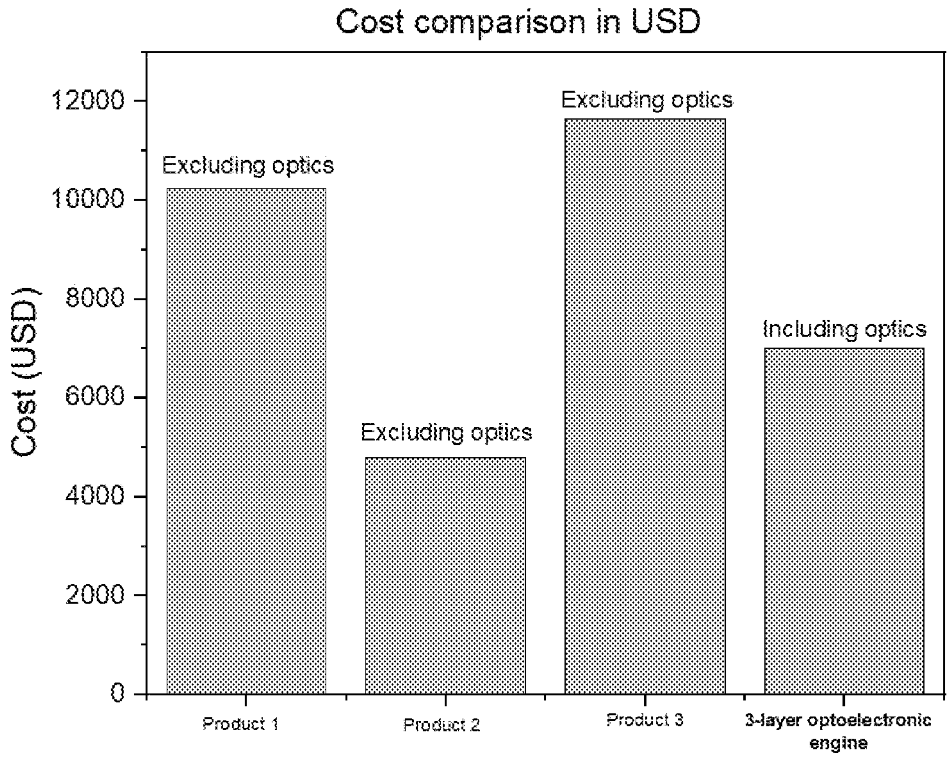

FIG. 7F illustrates a graph of cost comparison in a 3-layer opto-electronic engine with similar existing products, according to one example embodiments of the invention.

DETAILED DESCRIPTION OF THE INVENTION

Reference will now be made in detail to the description of the present subject matter, one or more examples of which are shown in the figures. Each example is provided to explain the subject matter and not a limitation. Various changes and modifications obvious to one skilled in the art to which the invention pertains are deemed to be within the spirit, scope and contemplation of the invention.

As used in the application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

The word "exemplary" is used herein to mean "serving as an example, instance, or illustration." Any aspect described herein as "exemplary" is not necessarily to be construed as preferred or advantageous over other aspects.

As used in this description, the terms "component", "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone," "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, a microcontroller, or a hand-held computer with a wireless connection or link.

FIG. 1A illustrates system architecture of assembly of a 3-layer opto-electronic engine 100 consisting of multiple layers such as first layer 101 connected with second layer 103 by using plurality of BGA bumps 107. The second layer 103 is connected with third layer 105 by using plurality of edge connectors 109. All three layers such as the first layer 101, second layer 103 and third layer 105 have defined dimensions. In some example embodiments the dimensions of first layer 101, second layer 103 and third layer 105 are hexagonal in shape with side length 55 mm. The third layer 105 is connected to mother board 102. In some example embodiments third layer 105 is connected to mother board 102 through connectors. In some example embodiments the first layer 101 maybe trans-receiving layer, second layer 103 may be memory layer and third layer may be power layer.

As an alternative embodiment, dedicated hardware implementations, such as application specific integrated circuits, programmable logic arrays and other hardware devices, can be constructed to implement one or more of the methods described herein. Applications that may include the apparatus of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

FIG. 1B illustrates the topside view of first layer of assembly of a 3-layer opto-electronic engine-combination of two identical interposer layers, top side illustrates 2 half interposers namely left interposer 101A and right interposer 101B. Left interposer 101A comprises a first processor 104A (i.e., first FPGA) and a first plurality of high-speed transceivers. In some example embodiment first plurality of transceivers may be high speed optoelectronic connectors (i.e. transceivers). Right interposer 101B comprises a second processor 104B (i.e. second FPGA) and a second plurality of high speed transceivers. In some example embodiment a second plurality of transceivers may be high speed optoelectronic connectors. The first plurality of transceivers comprises a first transmitter 111A and a first receiver 111B, a second transmitter 113A and a second receiver 113B, a third transmitter 115A and a third receiver 115B. The second plurality of transceivers comprises a fourth transmitter 117A and a fourth receiver 117B, the fifth transmitter 119A and a fifth receiver 119B, a sixth transmitter 121A and a sixth receiver 121B. First layer 101 has a particular dimension. In some example embodiments dimension of first layer 101 may be 61×27 mm. There are a total of 12 high-speed transceivers each having capacity of 192 Gbps rendering an output speed of 2.304 Tbps. In some example embodiments a single a single optoelectronic connector may be providing speeds up to the limit of 16 Gbps. These optoelectronic connectors (LightKonnect™) may be electrically connected to first layer 101 surface with short differential traces between 12 to 38 mm. In some example embodiments the optoelectronic connector modules may support backplanes and optical modules, enhancing the flexibility of the interposer. In some example embodiments the optoelectronic connectors indicate the improved signal integrity when insertion and return losses for the electrical connections between optoelectronic connector modules and plurality of FPGAs 104 are specified as −1.58 dB and −17.2 dB for the frequency range of 0 to 12.5 GHz. in some example embodiments the first layer 101 divided into two interposers namely a left interposer 101A and a right interposer 101B each comprising a single FPGA 104 and six optoelectronic connectors. In some example embodiments the two trapezium shaped interposers may be but not limited for improving yield and addressing power dissipation concerns. In some example embodiments first layer 101 the plurality of optoelectronic connector modules is co-packed with the plurality of FPGA 104 on a single layer to show the compact design abilities of the optoelectronic connectors. In some example embodiments the plurality of interposers of the first layer 101 are integrated with the second layer 103 may be with but not limited to micro solder bumps for improved electrical connections.

FIG. 1C illustrates schematic view of left interposer associated with first layer of assembly of a 3-layer opto-electronic engine. The FPGA 104A is connected to the first transmitter 117A using first set of connections 102A, to the second transmitter 119A using second set of connections 102B, to third transmitter 121A using third set of connections 102C. In some other example embodiments FPGA is connected to the first receiver 117B using a fourth set of connections, to second receiver 119B using the fifth set of connections and third receiver 121B using sixth set of connections (not shown in figure). In some example embodiments the first FPGA 104A may be ARRIA 10 GX FPGA. In some other example embodiments, the first FPGA 104A may be designed for but not limited to advanced computational applications such as high-performance and high-bandwidth computing. In some other example embodiments, the ARRIA 10 GX FPGA comprises additional advantages such as enhanced integration and adaptability, particularly in terms of I/O, routing, and processing capabilities. In some example embodiments the first FPGA 104A comprises a large number of integrated transceivers may be but not limited for supporting backplanes and optical modules.

FIG. 1D illustrates schematic view of right interposer associated with first layer of assembly of a 3-layer opto-electronic engine. The FPGA 104B is connected to the fourth transmitter 111A using seventh set of connections 102D, to the fifth transmitter 113A using eighth set of connections 102E, to sixth transmitter 115A using ninth set of connections 102F. In some other example embodiments FPGA is connected to the fourth receiver 111B using a tenth set of connections, to fifth receiver 113B using the eleventh set of connections and sixth receiver 115B using twelfth set of connections (not shown in figure). In some example embodiments the second FPGA 104B may be ARRIA 10 GX FPGA. In some other example embodiments, the second FPGA 104B may be designed for but not limited to advanced computational applications such as high-performance and high-bandwidth computing. In some other example embodiments, the ARRIA 10 GX FPGA comprises additional advantages such as enhanced integration and adaptability, particularly in terms of I/O, routing, and processing capabilities. In some example embodiments the second FPGA 104B comprises a large number of integrated transceivers, maybe but not limited to supporting backplanes and optical modules. In some example embodiments the electrical mounting of first layer 101 on the surface second layer 103 may be but not limited to achieve path length efficiency.

FIG. 2A illustrates schematic view of a system architecture of top side associated with second layer of assembly of a 3-layer opto-electronic engine, according to one example embodiments of the invention. In some example embodiments the topside of second layer 103 comprises the first layer 101 connected via BGA bumps 107 or plurality of left interposer bumps 131A and plurality of right interposer bumps 131B may be observed also at the peripherals of topside of second layer a plurality of memories 213 may be placed. In some example embodiments the topside of the second layer is also known as the first surface 123 and the components present on the first surface 123 may be a plurality of first electronic components. The processors 104 of the first layer 101 are coupled with a plurality of memories 213 of the second layer. The plurality memory 213 includes a first DDR4 RAM 213A, a second DDR4 RAM 213B, a third DDR4 RAM 213C, a fourth DDR4 RAM 213D, a fifth DDR4 RAMs 213E, a sixth DDR4 RAM 213F, a seventh DDR4 RAM 213G and a eighth DDR4 RAM 213H is placed on the topside of second layer 103. In some example embodiments topside of second layer 103 consisting of six mounting holes named first mounting holes 215A, second mounting hole 215B, third mounting hole 215C, fourth mounting hole 215D, fifth mounting hole 215E and sixth mounting hole 215F. In some example embodiments these mounting holes may be placed near six vertices of the hexagonal topside associated with second layer 103. In some example embodiments, the top side of the second layer comprises a total of 32 GB of DDR4 RAM. In some example embodiments the topside of second layer 103 also comprises a plurality of temperature sensor. In some example embodiments the plurality of temperatures may be a first temperature sensor 201A and a second temperature sensor 201B. In some example embodiments the topside of second layer 103 further comprises a series NOR flash 203, a first clock buffer 205, a crystal oscillator 207, a power MOSFET transistor 209, a connector header mount 211, a Max 10 217 and a micro low profile header strip 219. In some example embodiments the temperature sensor measures the temperature of a location and converts it into an electrical signal. In some example embodiments the series NOR flash 203 can store small amounts of data for a long time without power. In some example embodiments the clock buffer 205 distributes multiple copies of a clock signal to multiple ICs with the same frequency requirements. In some example embodiments the crystal oscillator 207 is used for producing a stable clock signal. In some example embodiments the power MOSFET transistor 209 controls the current and voltage between the source and drain terminals in a circuit. In some example embodiments the connector header mount 211 enables transmission of current or signals.

In accordance with an embodiment, the processor 104A/104B may be of any type of processor, such as 32-bit processors using a flat address space, such as a Hitachi SH1, an Intel 80386, an Intel 960, a Motorola 68020 (or other processors having similar or greater addressing space). Processor types other than these, as well as processors that may be developed in the future, are also suitable. The processor may include general processor, Digital Signal Processing (DSP) chip, an Application Specific Integrated Circuit (ASIC), Field Programmable Gate Arrays (FPGAs), AT89S52 microcontroller firmware or a combination thereof.

Processors suitable for the execution of a computer program include, by way of example, both general and special purpose microprocessors, and anyone or more processors of any kind of digital computer. Generally, a processor receives instructions and data from a read only memory or a random-access memory or both. The essential elements of a computer are a processor for performing instructions and one or more memory devices for storing instructions and data. Generally, a computer also includes, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a GPS receiver, to name just a few. Computer readable media suitable for storing computer program instructions and data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The memory may be a non-transitory medium such as a ROM, RAM, flash memory, etc. The processor and the memory can be supplemented by, or incorporated in, special purpose logic circuitry.

The processes and logic flows described in the specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

In some example embodiments the 3D system in package may be connected with other systems using a network. In accordance with an embodiment, a network includes one or more networks such as a data network, a wireless network, a telephony network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks, code division multiple access (CDMA), wideband code division multiple access (WCDMA), wireless fidelity (Wi-Fi), wireless LAN (WLAN), Bluetooth®, Internet Protocol (IP) data casting, ZigBee satellite, mobile ad-hoc network (MANET), and the like, or any combination thereof.

Although the present specification describes components and functions that may be implemented in particular embodiments with reference to particular standards and protocols, the invention is not limited to such standards and protocols. For example, The ZigBee or ZigBee/IEEE 802.15.4 protocol is a specification created for wireless networking. It includes hardware and software standard design for WSN (Wireless sensor network) requiring high reliability, low cost, low power, scalability and low data rate. Accordingly, replacement standards and protocols having the same or similar functions as those disclosed herein are considered equivalents thereof. In some example embodiments IEEE 802.3 Ethernet and InfiniBand protocols are complied.

In the available processors a computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

FIG. 2B illustrates schematic view of a system architecture of bottom side associated with second layer of assembly of a 3-layer opto-electronic engine, according to one example embodiments of the invention. In some example embodiments the bottom side of the second layer is also known as the second surface 125 and the components present on the second surface 125 may be a plurality of second electronic components. In some example embodiments the processors 104 of the first layer 101 are coupled with a plurality of memories 213 of the second layer. The plurality memory 213 includes a ninth DDR4 RAM 213I, a tenth DDR4 RAM 213J, an eleventh DDR4 RAM 213K, a twelfth DDR4 RAM 213L, a thirteenth DDR4 RAM 213M, a fourteenth DDR4 RAM 213N, a fifteenth DDR4 RAM 213O and a sixteenth DDR4 RAM 213P is placed at the bottom side of second layer 103. In some example embodiments the bottom side associated with second layer 103 comprises a plurality of first position connectors. In some example embodiments the plurality of first position connectors further comprises a first position connector 303A and a second position connector 303B. In some example embodiments the bottom side associated with second layer 103 comprises a plurality of second position connectors 305. The second position connectors further comprise a third position connector 305A and a fourth position connector 305B. In some example embodiments the bottom side associated with second layer 103 comprises a plurality of small low power clock 307. The plurality of small low power clock further comprises a first plurality of small low power clock 307A and a second plurality of small low power clock 307B. In some example embodiments bottom side associated with second layer 103 comprises a plurality of shunt voltage reference IC. The plurality of the shunt voltage reference IC further comprises a first shunt voltage reference IC 309A and a second shunt voltage reference IC 309B. In some example embodiments bottom side associated with second layer 103 also comprises a PCIe packet switch 311, a second clock buffer 313, a voltage level translator 315, an 8-channel I2C switch 317, a flash memory IC 319, a linear regulator 321 and a plurality of high-speed ground plane socket strips 323. The plurality of high-speed ground plane socket strips 323 further comprises a first high-speed ground plane socket strips 323A and a second high-speed ground plane socket strips 323B. In some example embodiments the first position connector and the second position connector 305 to create a bridge between isolated circuits or interrupted positions in a circuit. In some example embodiments low power clock 307 enables overall functional design of a circuit. In some example embodiments the shunt voltage reference IC regulates the load by shunting excess current through the device to ground. In some example embodiments the PCIe packet switch 311 allows two hosts to allocate their own PCIe bus and memory resources. In some example embodiments the voltage level translator 315 converts signals from one voltage level to another. In some example embodiments the 8-channel I2C switch 317 allows the use of different bus voltages on each pair. In some example embodiments the flash memory IC 319 enables additional data storage to an application within a circuit. In some example embodiments the linear regulator 321 maintains a steady voltage output. In some example embodiments the high-speed ground plane socket strips 323 provide power or ground connections.

In some example embodiments the second layer 103 of the 3 layered optoelectronic engine comprises memory components for enabling but not limited to each FPGA individually connected to 16 GB of DDR4, enhancing memory capacity for System-in-Package applications. In some example embodiments the design of second layer 103 may be flexible, making it suitable for multiple applications. In some example embodiments the third processor (Intel MAX 10) 217 has features but not limited for integration of programmable clock ICs for high-speed transceiver banks, enabling modification of clock signals to meet system demands. Further, control is achieved using the I2C feature which further enables system controller with multi-purpose functionality. In some example embodiments the MAX 10 217 on second layer 105 serves as a programmable module for a multi-rail power sequencer and monitoring. In some example embodiments the second layer 105 comprising the PCIe switch 311 enables but not limited for Arria10 FPGAs 114 to communicate as downstream, and the host system communicates as upstream. Further the downstream communication and the host system communication/upstream communication is further explained in the FIG. 5 of the disclosure.

FIG. 3A illustrates schematic view of a system architecture of top side associated with third layer of assembly of a 3-layer opto-electronic engine, according to one example embodiments of the invention. In some example embodiments the topside of the third layer 105 is also known as the first surface 127 and the components present on the first surface 127 may be a plurality of third electronic components. In some example embodiments the top side associated with third layer 105 of assembly of a 3-layer opto-electronic engine comprises a plurality of N-MOSFET transistor 401A, a plurality of surface mount Silicon Schottky diode 401B and a plurality of LEDs. In some example embodiments the plurality of LEDs further comprises a blue SMD chip LED lamp 403A, a first plurality of bright green chip LED 403B and a second plurality of bright green chip LED 403C. In some example embodiments the top side associated with third layer 105 also comprises a plurality of ultra micro power terminals. In some example embodiments the plurality of ultra micro power terminals further comprises a first plurality of ultra micro power terminals and a second plurality of ultra micro power terminals 407. The first plurality of ultra micro power terminals comprises a first ultra micro power terminal 405A and a second ultra micro power terminal 405B. In some example embodiments second plurality of ultra micro power terminals 407 comprises a third ultra micro power terminal 407A and a fourth ultra micro power terminal 407B. In some example embodiments the top side associated with third layer 105 comprises a plurality of power MOSFET transistor 409. The plurality of power MOSFET transistors 409 further comprises a first plurality of power MOSFET transistor 409A, a second plurality of power MOSFET transistor 409B, a third plurality of power MOSFET transistor 409C, a fourth plurality of power MOSFET transistors. In some example embodiments the top side associated with third layer 105 comprises a plurality of board-to-board connectors. The plurality of board-to-board connectors further comprises a first board-to-board connectors 411A and a second board-to-board connectors 411B. In some example embodiments the top side associated with third layer 105 comprises a fourth plurality of power MOSFET transistors 413A, a fifth plurality of power MOSFET transistors 413B and a sixth plurality of power MOSFET transistors 413C. In some example embodiments the top side associated with third layer 105 comprises a plurality of diode controller. The plurality of diode controller further comprises a first diode controller 415A and a second diode controller 415B. In some example embodiments the top side associated with third layer 105 comprises a plurality of power MOSFET 417. The plurality of power MOSFET 417 further comprises a first plurality of power MOSFET 417A and a second plurality of power MOSFET 417B. In some example embodiments the top side associated with third layer 105 comprises a micro-controller 419, a low profile SMD sub-miniature slide switch 421, a first low voltage ideal diode controller 423, a second low voltage ideal diode controller 429, a voltage level translator dc dc voltage translator 425, a first voltage regulator 427, a second voltage regulator 431, a plurality of voltage controllers 433 and a second plurality of mounting holes 435. In some example embodiments topside of the third layer 105 comprises a second plurality of mounting holes 435 named a seventh mounting hole 435A, an eighth mounting hole 435B, a ninth mounting hole 435C, a tenth mounting hole 435D, an eleventh mounting hole 435E and a twelfth mounting hole 435F. In some example embodiments these mounting holes 435 may be placed near six vertices of the hexagonal topside associated with third layer 105.

In some example embodiments the N-MOSFET transistor 401A enables switching or amplifying signals. In some example embodiments the surface mount Silicon Schottky diode 401B enable as rectifiers in switching regulators, power supplies, and voltage clamping circuits. In some example embodiments the blue SMD chip LED lamp 403A converts electrical current into high-energy light, including invisible ultraviolet, violet, or blue wavelengths. In some example embodiments the bright green chip LED 403B may be a small electronic component that emits green light. In some example embodiments the first plurality of ultra-micro power terminal and second plurality of ultra-micro power terminal 407 may provide power and signal/ground solutions. In some example embodiments the power MOSFET transistor 409 may control high current or power in circuits. In some example embodiments the plurality of board-to-board connectors may enable connection printed circuit boards (PCBs) without a cable. In some example embodiments the plurality of diode controller may hold but not limited to source-to-drain voltage at 25 mV. In some example embodiments the microcontroller 419 may be but not limited to control a singular function in a device. In some example embodiments the sub-miniature slide switch 421 allows control of a circuit's current flow without having to manually splice or cut wire.

In some example embodiments the third layer 105 comprises multiple power supplying components. The 3-layered optoelectronic engine 100 demands but not limited to multiple voltage supply rails with stringent regulation accuracy and sequencing specifications for its diverse set of devices. In some example embodiments the third layer 105 addresses but not limited the complexity by incorporating a power supply circuit structure and a sophisticated power sequencer 803 In some example embodiments the third layer 105 comprises the power sequencer 803 for enabling but not limited to governing the overall power of the system by seamlessly integrating various power supplies and their control circuits. In some example embodiments the third layer 105 enhances the stability and reliability of 3-layered optoelectronic engine 100 by utilizing differential remote sense pins to actively monitor critical parameters such as VCC and other power supplies. In some example embodiments the third layer 105 have the total power consumption but not limited to 180 W driven by an ATX, boasts 13 power regulator ICs accompanied by supporting passives and other ICs. In some example embodiments the third layer 105 ensures comprehensive integration, optimal performance and managing the intricate power requirements of 3-layered optoelectronic engine 100 with the help of approximately 52 ICs and a diverse array of components such as power modules, voltage level shifters to ADC and the power sequencer 803. Further the power requirements of the 3-layered optoelectronic engine 100 further explained in the FIG. 6 of the disclosure.

FIG. 3B illustrates schematic view of a system architecture of bottom side associated with third layer of assembly of a 3-layer opto-electronic engine, according to one example embodiments of the invention. In some example embodiments the bottom side of the third layer 105 is also known as the second surface 129 and the components present on the second surface 129 may be a plurality of fourth electronic components. In some example embodiments the bottom side associated with third layer 105 of assembly of a 3-layer opto-electronic engine 100 comprises a plurality of non-isolated DC/DC converters. The plurality of non-isolated DC/DC converters further comprises a first non-isolated DC/DC converter 501A and a second non-isolated DC/DC converter 501B. In some example embodiments the bottom side associated with third layer 105 of assembly of a 3-layer opto-electronic engine 100 comprises a mezzanine connector 503, a plurality of step-down DC/DC μModule regulators. The plurality of step-down DC/DC μModule regulators further comprises a first step-down DC/DC μModule regulator 505A and a second step-down DC/DC μModule regulator 505B. In some example embodiments the bottom side associated with third layer 105 comprises a power supply controller 507, a first DC/DC controller and switching regulator chip 509, a second DC/DC controller and switching regulator chip 511, a plurality of DIP switches further comprising a first DIP switch 513 and a second DIP switch 519, a plurality of filters further comprising a first plurality filters 515A and a second plurality of filters 515B, a high performance connector 517, a plurality of N-MOSFET transistors 521, a plurality of tact switches 523, a wire wound inductor 525, a power terminal header 527, a plurality of DC/DC POL converter module further comprising a first DC/DC POL converter module 529A and a second DC/DC POL converter module 529B, a third DC/DC controller and switching regulator chip and a power MOSFET transistor 533.

FIG. 4 illustrates a block diagram of the first layer associated with assembly of a 3-layer opto-electronic engine, according to one example embodiments of the invention. In some example embodiments the block diagram of first layer of the 3-layer opto-electronic engine comprises a first processor 104A (i.e., FPGA) and a first plurality of high-speed transceivers. In some example embodiment first plurality of transceivers may be high speed optoelectronic connectors. Further comprises a second processor 104B (i.e., FPGA) and a second plurality of high-speed transceivers. In some example embodiment a second plurality of transceivers may be high speed optoelectronic connectors. The first plurality of transceivers comprises a first transmitter 111A and a first receiver 111B, a second transmitter 113A and a second receiver 113B, a third transmitter 115A and a third receiver 115B. The second plurality of transceivers comprises a fourth transmitter 117A and a fourth receiver 117B, the fifth transmitter 119A and a fifth receiver 119B, a sixth transmitter 121A and a sixth receiver 121B. Components present within the first layer shown within block 601. Components placed outside block 601 such as CDN (Clock Distribution Network) 307, DDR4 213 and PCIe 311 may be from the second and third layer respectively. There are a total of 12 high-speed transceivers each having capacity of 192 Gbps rendering an output speed of 2.304 Tbps. In some example embodiments a single a single optoelectronic connector may be providing speeds up to the limit of 16 Gbps. These optoelectronic connectors (LightKonnect™) may be electrically connected to first layer 101 surface with short differential traces between 12 to 38 mm. In some example embodiments the optoelectronic connector modules may support backplanes and optical modules, enhancing the flexibility of the interposer. In some example embodiments the optoelectronic connectors indicate the improved signal integrity when insertion and return losses for the electrical connections between optoelectronic connector modules and plurality of FPGAs 104 are specified as −1.58 dB and −17.2 dB for the frequency range of 0 to 12.5 GHz. In some example embodiments the first layer 101 divided into two interposers namely a left interposer 101A and a right interposer 101B each comprising a single FPGA 104 and six optoelectronic connectors. In some example embodiments, a heat spreader may be placed between the bottom side of the second layer and the top side of the bottom layer. The heat spreader, when connecting electronic circuit boards, serves to efficiently manage and disperse heat away from components of the top side of the second layer when heat spreader is placed between top side of the third layer and the bottom side of the second layer, it facilitates the even distribution of generated heat across its surface, made of highly conductive materials like copper or aluminum, ensuring that hotspots don't damage sensitive components. By regulating temperatures and providing a barrier against overheating, it safeguards interconnected systems, enabling optimal performance and extending the lifespan of the electronic components involved.

FIG. 5 illustrates a block diagram of a system architecture of second layer associated with assembly of a 3-layer opto-electronic engine, according to one example embodiments of the invention. In some example embodiments the block diagram of a system architecture of second layer comprises a large block 701 further comprising DDR4 RAM 213, MAX 10 217, PCIe switch 311, 12C Multiplexer 317, temperature sensor, Fan control, JTAG, NOR Flash 203 etc. Components present outside block 701 may be from the first or third layer respectively. In some example embodiments the Plurality of FPGA has 24 sub banks each. In some example embodiments 12 banks are connected to plurality of optoelectronic connectors 717, in some example embodiments 8 banks are connected to PCIe each and other 4 banks are used for inter-FPGA communication. In some example embodiments each of plurality of optoelectronic connector 717 has both transmitting and receiving modules. Each of the transmitting or receiving modules may have more than one channel. In some example embodiments third processor 217 controls the clock (i.e. PLL Clock) for the FPGA 104 functioning where the clock signal is always 625 MHz, that is further configured based on data rate requirements. Consider a transmitting module with 12 channels, that needs to transmit data at different data rates. Such data rates are provided by the clock that is configured using the third processor. Further, the FPGA 104 receives the signals emphasizing the data rates, based on that memory is accessed for data. Meanwhile, user may configure registers of the transmitting module using I2C, to align with data rate requirement of the clock. In some example embodiments, first 4 channels of the transmitting module may be configured to transmit at one data rate and other 8 channels may be configured to transmit at another data rate. In the opto-electronic engine 100 there are about six transmitting modules and six receiving modules, each of the transmitting module and receiving modules have 12 channels. In case of receiving modules similar clock and I2C configuration is performed via respective processors by a user to receive signals at different data rates. In some example embodiment the PCIe connection 705 connects the PCIe cards from outside and the flow of data from PCIe cards to plurality of FPGAs 104 is called downstream. In some example embodiments the connection between 3-layer opto-electronic engine 100 and PCIe cards at server rack is established by PCIe connectors 705 and PCIe switch 311.

The usage of banks is decided by the plurality of FPGAs 104 based on availability. The DDR4 RAMs reserved for both FPGAs 104 is for flash memory to store the data which is flowing into the entire 3-layer opto-electronic engine 100. In some example embodiments the clock signal may be but not limited to 625 MHz. In some example embodiments the plurality of sink and source DDR termination regulators 709 may be but not limited for initiation and termination of DDR4 RAMs 709A. In some example embodiments temperature sensor may be placed on each of the FPGAs 104 to measure the real time temperature of the plurality of FPGAs 104. In some example embodiments the third processor 217 controls the Fan control 711 based on the temperature data obtained from temperature sensor.

FIG. 6 illustrates a block diagram of a system architecture of third layer associated with assembly of a 3-layer opto-electronic engine, according to one example embodiments of the invention. In some example embodiments the block diagram of a system architecture of third layer comprises all power supply components such as voltage controllers, power controllers, voltage convertors, voltage switches, dip switches, etc. All the components present within block 801 are the components of the third layer. Other components such as plurality of FPGA, optoelectronic connectors, PCIe connectors, power sequencer etc. may be from the first and second layer. In some example embodiments the third layer 105 comprises a reverse supply protection 709 and voltage protection control circuit 707 may be but not limited to protect the power supply components from damaging. In some example embodiments the third layer 105 comprises an IC-8-channel PMEBus power system manager 711 to sequence and trim the power supply. In some example embodiments PCIe signals 713 received with the help PCIe switches 311 may be but not limited for controlling the PCIe hierarchy. In some example embodiments the third layer 105 comprises components explained in FIG. 3A and FIG. 3B. In some example embodiments the block 801 components provide the required voltage and current supplies to each of the plurality of first components and plurality of second components may be belong to second layer 103 of the 3-layer opto-electronic engine 100. In the second layer 103 and third layer 105 components are placed on both sides. Use of double-sided sockets and solder of self-assembly of parts enable placing the components on both second layer 103 and third layer 105.

FIG. 7A illustrates a graph of data speed comparison in a 3-layer opto-electronic engine with similar existing products, according to one example embodiments of the invention. In some example embodiments the 3-layer optoelectronic engine 100 has the data rate limited to 1192 Gbps, similarly for the product 1 has 448 Gbps, product 2 has 40 Gbps and product 3 has 224 Gbps. In some example embodiments the 3-layered optoelectronic engine has shown improved data rate compared to any existing technology compared in the graph.

FIG. 7B illustrates a graph of operating temperature comparison in a 3-layer opto-electronic engine with similar existing products, according to one example embodiments of the invention. In some example embodiments the operation temperature for 3-layer optoelectronic engine 100 has operating temperature from −40 to 65 degree Celsius. Whereas product 1 has-40 to 65 degrees Celsius, product 2 has 0 to 70 degrees Celsius and product 3 has operating temperature of 0 to 45 degree Celsius. The comparison plot of operating temperatures shows 3-layer optoelectronic engine 100 has better operating temperature.

FIG. 7C illustrates a graph of power consumption comparison in a 3-layer opto-electronic engine with similar existing products, according to one example embodiments of the invention. In some example embodiments the plot of power consumption of various other products compared to 3-layered optoelectronic engine 100 shows power consumed by 3-layered optoelectronic engine is >100 Watts, product 1 consumes 225 Watts, product 2 consumes 66 Watts and product 3 consumes about ≤225 Watts. In some example embodiments the 3-layered optoelectronic engine 100 has optimum power consumption.

FIG. 7D illustrates a graph of footprint comparison in a 3-layer opto-electronic engine with similar existing products, according to one example embodiments of the invention. In some example embodiments the footprint (surface area) of 3-layered optoelectronic engine 100 is 200 $cm^3$. In some example embodiments product 1 has 1385 $cm^3$ surface area, product 2 has 405 $cm^3$ surface area, product 3 has 766 $cm^3$. In some example embodiments the 3-layered optoelectronic engine 100 showed lesser footprint compared to any other existing products.

FIG. 7E illustrates a graph of processor speed comparison in a 3-layer opto-electronic engine with similar existing products, according to one example embodiments of the invention. In some example embodiments the 3-layered optoelectronic engine 100 has processor speed up to 3.1 TFLOPS. In some example embodiments the product 1 has processor speed up to 4.1 TFLOPS, product 2 has processor speed up to 1.3 TFLOPS and product processor speed up to 1.8 TFLOPS.

FIG. 7F illustrates a graph of cost comparison in a 3-layer opto-electronic engine with similar existing products, according to one example embodiments of the invention. In some example embodiments the 3-layer opto-electronic engine 100 costs around ~7000 USD including optics. In some example embodiments product 1 costs around 10250 USD excluding optics, product 2 costs 4800 USD excluding optics and the product 3 costs around 11650 USD excluding optics. In some example embodiments the 3-layer opto-electronic engine 100 costs comparatively less including optics.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

We claim:

1. A 3-layer opto-electronic engine (100), comprising:
- a first layer (101) that includes:
  - a plurality of processors (104), and
  - a plurality of optoelectronic connectors (717), wherein the plurality of optoelectronic connectors (717) is arranged to surround the plurality of processors (104);
- a second layer (103) that is connected to the first layer (101), wherein
  - the second layer (103) includes:
    - a first surface (123) that faces the first layer (101), and
    - a second surface (125) that is opposite to the first surface (123),
  - the first surface (123) includes:
    - a plurality of first memories (709A), and
    - a plurality of first electronic components, and
  - the second surface (125) includes:
    - a plurality of second memories (709B) that is different from the plurality of first memories (709A), and
    - a plurality of second electronic components that is different from the plurality of first electronic components; and
- a third layer (105) connected to at least one the first layer (101) or the second layer (103), wherein
  - the third layer (105) includes:
    - a first surface (127) that faces the second layer (103), and
    - a second surface (129) that is opposite to the first surface (127) of the third layer (105),
  - the first surface (127) of the third layer (105) includes a plurality of third electronic components that is different from the plurality of first electronic components and the plurality of second electronic components, and
  - the second surface (129) of the third layer (105) includes a plurality of fourth electronic components that is different from the plurality of first electronic components, the plurality of second electronic components, and the plurality of third electronic components.

2. The 3-layer opto-electronic engine (100) of claim 1, wherein the plurality of first electronic components includes two or more of a plurality of temperature sensors, a series NOR flash (203), a first clock buffer (205), a crystal oscillator (207), a first power MOSFET transistor (209), a connector header mount (211), a micro low-profile header strip (219), or a combination thereof.

3. The 3-layer opto-electronic engine (100) of claim 1, wherein the plurality of second electronic components includes two or more of a plurality of position connectors, a plurality of low power clocks (307), a plurality of shunt voltage reference ICs, a PCIe packet switch (311), a second clock buffer (205), a first voltage level translator (315), an 8-channel I2C switch (317), a flash memory IC (319), a linear regulator (321), a plurality of high-speed ground plane socket strips (323), or a combination thereof.

4. The 3-layer opto-electronic engine (100) of claim 1, wherein the plurality of third electronic components includes two or more of a plurality of N-MOSFET transistor, a plurality of surface mount Silicon Schottky diodes (401B), a plurality of LEDs, a plurality of ultra-micro power terminals, a plurality of board-to-board connectors, a plurality of diode controllers, a microcontroller (419), a low profile SMD sub-miniature slide switch (421), a first low voltage ideal diode controller, a second low voltage ideal diode controller (423), a second voltage level translator, a first voltage regulator, a second voltage regulator, a plurality of voltage controllers (433), or a combination thereof.

5. The 3-layer opto-electronic engine (100) of claim 1, wherein the plurality of fourth electronic components includes two or more of a plurality of non-isolated DC/DC converters, a mezzanine connector (503), a plurality of step-down DC/DC µModule regulators, a power supply controller (507), a plurality of DC/DC controllers (509), a plurality of switching regulator chips (511), a plurality of DIP switches (513), a plurality of filters, a plurality of N-MOSFET transistors, a plurality of tact switches (523), a wire wound inductor (525), a power terminal header (527), a plurality of DC/DC POL converters, or a combination thereof.

6. The 3-layer opto-electronic engine (100) of claim 1, wherein the first layer (101) further includes a plurality of trapezium shaped interposers, and each trapezium shaped interposer of the plurality of trapezium shaped interposers includes:

at least one processor (104) of the plurality of processors, and a set of optoelectronic connectors (717) of the plurality of optoelectronic connectors.

7. The 3-layer opto-electronic engine (100) of claim 1, further comprising a mother board (102) that is connected to the third layer (105).

8. The 3-layer opto-electronic engine (100) of claim 1, wherein the first layer (101) is connected to the second layer (103) via solder bumps (107).

9. The 3-layer opto-electronic engine (100) of claim 1, wherein the second layer (103) is connected to the third layer (105) via a plurality of edge connectors (109).

10. The 3-layer opto-electronic engine (100) of claim 1, wherein shape of each of the first layer (101), the second layer (103), and the third layer (105) corresponds to a hexagonal shape.

* * * * *